United States Patent [19]

Gobeil

[11] Patent Number: 4,753,003
[45] Date of Patent: Jun. 28, 1988

[54] BANDOLEER OF CONTACT CARRIERS FOR USE IN POWER CRIMPING TOOL

[75] Inventor: Richard W. Gobeil, Los Angeles, Calif.

[73] Assignee: McDonnell Douglas Corp., St. Louis, Mo.

[21] Appl. No.: 52,393

[22] Filed: May 21, 1987

[51] Int. Cl.⁴ .............................................. B65D 73/02
[52] U.S. Cl. ..................................... 29/884; 206/330; 439/885
[58] Field of Search .................. 29/884; 206/328, 330; 439/885

[56] References Cited

U.S. PATENT DOCUMENTS

| 3,129,814 | 4/1964 | Cheh et al. | 206/330 |
| 3,523,608 | 8/1970 | Miller | 206/330 |
| 4,004,688 | 1/1977 | Braden | 206/330 |
| 4,586,607 | 5/1986 | Dubbs et al. | 206/330 X |

Primary Examiner—Howard N. Goldberg
Assistant Examiner—Taylor J. Ross
Attorney, Agent, or Firm—Beehler, Pavitt, Siegemund, Jagger, Martella & Dawes

[57] ABSTRACT

An improved bandoleer of contact carriers for use in a power crimping tool is provided by assembling a plurality of separate contact carriers. Each contact carrier has a uniform exterior size and shape and is further provided with a male connector radially extending from one side, and the diametrically opposite side of the contact carrier is provided with a female connector radially extending from the contact carrier. The female and male connectors are arranged and configured to resiliently couple to corresponding and appropriate opposite connectors with the adjacent contact carrier in the bandoleer. The male connector is a longitudinal web having a longitudinal bulbous portion. The female connector is a socket connector having a restricted opening smaller than the bulbous portion of the male connector. However, the inherent resiliency of the female socket allows the restricted portion to expand to permit passage of the bulbous portion of the male connector into the female socket. Thereafter the restricted opening closes to retain the male connector of the adjacent contact carrier. The contact carriers are color coded according to the gauge of electrical contact or the type of electrical contact contained within the contact carrier. Therefore, depending upon the fabrication sequence which is to be practiced, a color coded bandoleer is assembled with the appropriate type, gauge and number of contact carriers in the corresponding electrical contacts in an appropriate and arbitrarily selected sequence. The bandoleer can then be indexed into a power crimping tool.

20 Claims, 1 Drawing Sheet

BANDOLEER OF CONTACT CARRIERS FOR USE IN POWER CRIMPING TOOL

BACKGROUND OF THE INVENTION

The present invention relates to the field of designs for electrical contacts and carriers therefor, and a method for using the same. More particularly, the invention relates to a contact carrier which can be assembled into a customized sequence of contact carriers in a bandoleer and method of using a bandoleer so assembled.

Electrical crimping tools used in productions lines, for example in the assembly of electrical circuitry used in aircraft, require the rapid feed of electrical contacts into a tool so that the contacts may be rapidly crimped onto the wires and inserted into the tools at high production rates.

Typically the prior art has devised cylindrical contact carriers made of plastic into which carriers the contacts are temporarily placed. The contact carriers are fabricated in long strings or bandoleers of molded integral pieces, each carrier carrying a single electrical contact. The bandoleer of contact carriers are then fed into the automated power crimping tools, which remove the contact from the contact carrier, place the contact in a die crimping position, and then crimp the contact to a wire inserted into the contact. The bandoleer is then indexed within the tool and the next contact carrier is positioned for utilization. Thus, the bandoleer of electrical contacts is fed into the power crimper like a bandoleer of ammunition into a machine gun.

However, several gauges of wires and corresponding different gauges of electrical contacts are typically utilized during assembly of a single aircraft. Because of the expense of the power crimping tools, a separate tool cannot be provided for each different gauge of wire which needs to be crimped. Instead, the fabricator is provided with a plurality of bandoleers, each carrying a different gauge electrical contact. Because the bandoleers are made of contact carriers of unitary extruded plastic, each bandoleer can carry only one gauge electrical contact. When the gauge of the electrical contact changes, the bandoleer must be removed from the power crimper and a new bandoleer inserted. This necessarily slows the fabrication process.

Therefore, what is needed is a bandoleer and a method of providing a bandoleer which can be customized to each fabrication sequence wherein the appropriate gauge contact is provided at the necessary point in the fabrication sequence without the need to stop, unload the power crimper, search and obtain a bandoleer having the appropriate gauge size, and then load the chosen bandoleer back into the power crimping tool.

BRIEF SUMMARY OF THE INVENTION

The invention is a contact carrier including an arbitrarily sized and designed electrical contact temporarily disposed in the carrier. The invention comprises a body, a mechanism included within the body for temporarily retaining the electrical contact, a male connector extending from the body and connected therewith, and a female connector extending from the body and connected therewith. The female connector is arranged and configured to temporarily engage the male connector of one of the adjacent contact carriers. The plurality of contact carriers are assembled into a bandoleer of contact carriers for use in the power crimping tool.

Each of the contact carriers of the bandoleer is arbitrarily positioned in a linear sequence of contact carriers formed by the plurality of contact carriers which comprises the bandoleer.

As a result, the bandoleer is assembled from an arbitrary sequence of the contact carriers. Each contact carrier is capable of including an arbitrary type or size of electrical contact.

The body has an exterior surface and a longitudinal axis. The male connector and female connector radially extend from the exterior surface of the body.

The male connector and female connector radially extend from diametrically opposing positions on the exterior surfaces of the body.

The male connector mechanism of one contact carrier and the female connector mechanism of another contact carrier are arranged and configured to resiliently engage and disengage each other.

The male connector is a radially extending web having a base. The web is connected at its base to the body. The web has a longitudinal bulbous portion of enlarged cross section. The female connector is a longitudinal socket radially extending from the body defining an interior cavity for receiving the bulbous portion of the web and further including a restriction of smaller spatial extent than the diameter of the bulbous portion of the web. The restriction of the female connector is resilient in order to temporarily permit passage of the bulbous portion of the web of the male connector from an adjacent one of the contact carriers through the restriction. The restriction closes on the web of the male connector of the adjacent carriers. As a result the adjacent carriers are resiliently engaged with each other.

The body includes an internal shoulder portion having a contact bore defined therethrough. The contact bore has a selected diameter corresponding to the gauge of the contact disposed in the contact carrier. The diameter of the contact bore is arbitrarily chosen within the inherent size limitations of the corresponding contact carrier. As a result contacts of arbitrary gauges may be accommodated by each of the contact carriers.

The invention can also be characterized as a bandoleer of contact carriers. Each contact carrier includes an electrical contact of arbitrary gauge within the corresponding contact carrier. The bandoleer is for use within a crimping tool and comprises a plurality of contact carriers. Each contact carrier comprises a separate body from each other one of the contact carriers. A mechanism is included within each contact carrier for selectively and temporarily mechanically coupling arbitrary ones of the contact carriers with each other to form the bandoleer.

Each contact carrier is formed of resilient material and the mechanism for coupling the contact carriers with each other is for resiliently mechanically coupling adjacent contact carriers.

The plurality of contact carriers which comprises the bandoleer includes a plurality of electrical contacts of different gauges within the bandoleer.

The contact carriers which comprise the bandoleer are assembled within the bandoleer in a preselected sequence according to the gauge of the electrical contact included within each corresponding contact carrier and a predetermined sequence of crimped contacts to be fabricated.

The plurality of contact carriers which comprises the bandoleer may also include a plurality of different types of electrical contacts disposed within each of the corresponding contact carriers.

The invention is still further characterized as a method for providing a bandoleer of contact carriers. Each contact carrier includes an electrical contact having a gauge. The gauge of each electrical contact is arbitrarily and selectively varied according to a predetermined fabrication sequence. The method comprises the steps of providing a plurality of the contact carriers. Each contact carrier has an identical outside configuration. Each contact carrier includes a mechanism for resiliently coupling to an adjacent contact carrier. Each contact carrier is a separate integral body. Each of the contact carriers is resiliently coupled to an adjacent carrier to form a bandoleer of contact carriers. The contact carriers are combined in sequence to form the bandoleer according to the gauge of the electrical contact within each corresponding contact carrier according to the fabrication sequence. As a result each bandoleer is customized to the fabrication sequence and provides an appropriate gauge electrical contact at each step within the fabrication sequence.

In the step of resiliently coupling the contact carriers with each other, the contact carriers include an electrical contact of a distinguishable type. The bandoleer of electrical contact carriers is assembled by resiliently coupling a selected sequence of contact types according to the fabrication sequence.

Still further in the step of providing the contact carriers, each contact carrier corresponding to an electrical contact of a distinct gauge has a correspondingly distinct color. As a result the bandoleer is color coded according to the fabrication sequence.

The invention and its various embodiments are most easily visualized in the following drawings.

The invention and its various embodiments may be better understood by now turning to the following detailed description.

DETAILED DESCRIPTION OF THE PREFERRED EMBODIMENT

An improved bandoleer of contact carriers for use in a power crimping tool is provided by assembling the bandoleer from a plurality of separate contact carriers. Each contact carrier has a uniform exterior size and shape and is further provided with a male connector radially extending from one side, and the diametrically opposite side of the contact carrier is provided wtih a female connector radially extending from the contact carrier. The female and male connectors are arranged and configured to resiliently couple to corresponding and appropriate opposite connectors with the adjacent contact carrier in the bandoleer. The male connector is a longitudinal web having a longitudinal bulbous portion. The female connector is a socket connector having a restricted opening smaller than the bulbous portion of the male connector. However, the inherent resiliency of the female socket allows the restricted portion to expand to permit passage of the bulbous portion of the male connector into the female socket. Thereafter the restricted opening closes to retain the male connector of the adjacent contact carrier. The contact carriers are color coded according to the gauge of electrical contact or the type of electrical contact contained within the contact carrier. Therefore, depending upon the fabrication sequence which is to be practiced, a color coded bandoleer is assembled with the appropriate type, gauge and number of contact carriers in the corresponding electrical contacts in an appropriate and arbitrarily selected sequence. The bandoleer can then be indexed into a power crimping tool and continuously used throughout the fabrication sequence regardless of any required changes in the gauge of contact carrier or its type. The result is a reduction in fabrication times since bandoleers do not have to be changed when gauge or type of connectors is changed, and is a savings in cost since there is no wastage of electrical contacts which typically occurs when bandoleers are changed in a crimping tool.

Figure 1:
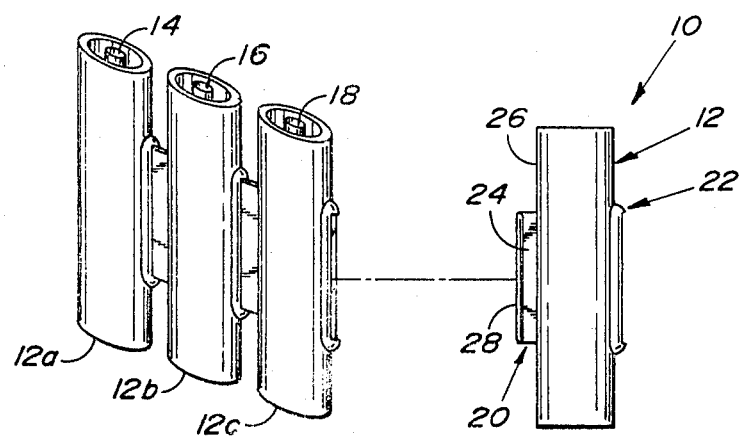
FIG. 1 is a perspective view of the invention showing a bandoleer of contact carriers with the end contact carrier separated from the bandoleer.

FIG. 1 is a perspective view of a small portion of a bandoleer, generally denoted by reference numeral 10, of the invention which includes a plurality of contact carriers 12 each of which includes a contact 14–18, only the upper ends of which are visible in FIG. 1. For the purposes of simplicity, three contact carriers are shown as joined according to the invention with a fourth contact carrier separated therefrom and shown in side elevational view. In a practical situation the bandoleers may be made of tens or even hundreds of contact carriers.

Figure 2:
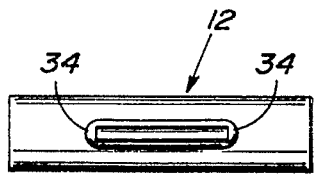
FIG. 2 is a side elevational view of one of the contact carriers of the bandoleer of FIG. 1.
Figure 3:
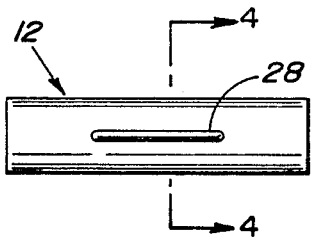
FIG. 3 is a side elevational view of the contact carrier of FIG. 2 as seen from the diametrically opposing side of the contact carrier.

FIGS. 1–3 should now be viewed together. Turn your attention to a single contact carrier 12. Each of the contact carriers is of identical length and diameter and are generally right circular cylinders made of molded plastic. Each contact carrier 12 is a separate piece and snaps together to form bandoleer 10 as depicted in FIG. 1. As shown in FIG. 1, each contact carrier includes a male tab 20 on one lateral side of the exterior cylindrical surface of contact carrier 12 as shown in side elevational view in FIG. 3. Diametrically opposing male tab 20 is a female socket 22, as best depicted in side elevational view in FIG. 2, which is also integrally formed as part of the body of contact carrier 12 and radially extends from a mid-position on the exterior surface of cylindrical contact carrier 12. Each contact carrier 12 is thus provided with an identically shaped male tab 20 and female socket 22 regardless of the gauge of contact 14–18 which may be disposed in contact carrier 12.

Figure 4:
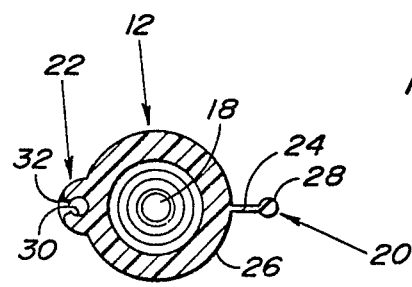
FIG. 4 is a cross-sectional view taken perpendicularly through the longitudinal axis of the contact carrier as noted by lines 4—4 of FIG. 3.

Turn now to the perpendicular cross-sectional view of FIG. 4 which is taken through line 4—4 of FIG. 3 and which better depicts the detailed sectional shape of female socket 22 and male tab 20. Contact 18 is slidingly secured within contact carrier 12 as will be better described in connection with FIG. 5. Both male tab 20 and female socket 22 are generally prismatic and have a substantially uniform cross section along their longitudinal lengths. For example, male tab 20 is comprised of a thin radially extending web portion 24 which extends form the exterior surface 26 of contact carrier 12 and terminates in a bulbous ridge portion 28. Female socket 22 defines an interior cavity of sufficient dimension to receive bulbous ridge portion 28 of male tab 20. The opening 32 to cavity 30 defined within female socket 22 is restricted or pinched down such that the passage of bulbous portion 28 of tab 20 through restriction 32 is resisted. However, the inherent resiliency of the material of which contact carrier 12 is fabricated is sufficient to allow the temporary expansion of restriction 32 and the insertion of bulbous portion 28 and tab 20 therein. Once bulbous portion 28 has passed through restriction 32, restriction 32 snaps back or closes inwardly and thereby resists the withdrawal of tab 20 from female socket 22.

As depicted in FIG. 2, the end portions 34 of female socket 22 are closed thereby forming a complete circumferential enclosure about the perimeter of male tab 20. Longitudinal motion of tab 20, and hence longitudinal motion of the adjacent contact carrier 12 with respect to the contact carrier to which it is connected, is thereby prevented. While the retaining force exerted by female socket 22 on tab 20 is sufficient to resist inadvertent detachment of adjacent contact carriers during normal handling, their assembly is easily manually accomplished.

Figure 5:
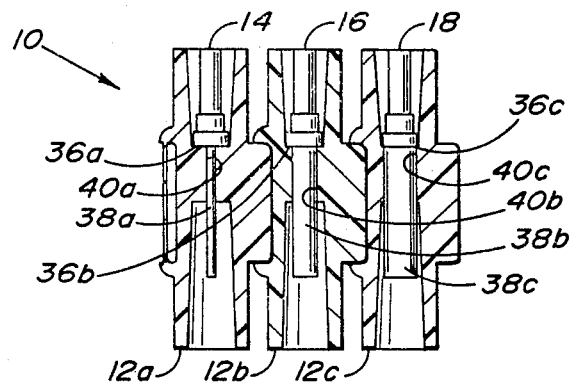
FIG. 5 is a longitudinal sectional view of a portion of a bandoleer of contact carriers as shown in FIGS. 1–4.

Turn now to FIG. 5 which illustrates a particularly advantageous aspect of the invention. FIG. 5 is a longitudinal sectional view of three contact carriers 12 of bandoleer 10. The longitudinal sectional view of contact carriers 12 graphically depicts the facility by which electrical contacts 14-18 of different gauges are accommodated within a single bandoleer 10. For example, electrical contact 14 is of a first or mid-size gauge. An interior shoulder section 36 of contact 12a is dimensioned to provide a slip fit to the body 38a of contact 14. There is sufficient frictional contact between electrical contact 14 and bore 40a of shoulder 36a such that contact 14 is securely retained within contact carrier 12a during all normal handling. However, ejection of contact 14 from contact carrier 12a is easily accomplished by the power crimping tool.

Similarly, contact carrier 12b includes an electrical contact 16 of a narrower gauge than contact 14. Contact carrier 12b thus has a shoulder portion 36b with an appropriately defined throughbore 40b to provide a similar slip fit with body 38b of contact 16. Similarly, contact carrier 12c is provided with yet contact 18 having a third gauge in which carrier shoulder portion 36c has a similarly sized bore 40c to accommodate body 38c of contact 18 which is a larger gauge, for example, than contact 14.

In the illustrated embodiment different gauges of the same type or design of contact are shown. However, it is entirely within the scope of the invention that different types of contacts could be mixed within the bandoleer as well.

It is evident by inspection of FIG. 5 that a bandoleer 10 may be assembled according to the invention with an arbitrary number of sequence of different types of contacts and gauges of contacts within a single bandoleer. Therefore, in a particular production job, a given fabrication phase may require making ten crimps on a contact of a first gauge followed by one contact of a second gauge, then by ten more contacts of the first gauge, and still followed by six contacts of a third gauge, and so forth. The number and type of contacts as well as there sequence will be determined by the nature of the fabrication task.

Contact carriers 12 of bandoleer 10 are separately color-coded, each color uniquely identifying a different gauge or contact type. The contacts can thus be readily assembled into the sequence of crimping operations as required in the particular fabrication sequence at hand into a single bandoleer and fed into the power crimping tool, such as a power crimping tool disclosed in my co-pending application Ser. No. 07/037,006 filed Apr. 10, 1987, entitled "Hand-Held Automatic Power Crimper", expressly incorporated herein by reference. Bandoleer 10, assembled according to the teaching of FIG. 5, is then loaded into the power crimping tool and used throughout the job sequence with the appropriate gauge being indexed into the tool at the appropriate point in the sequence without the necessity for unloading and reloading the tool.

As a result, not only is there a more efficient operation of the tool and shorter application times in completing wire harnesses, but there is also less material waste.

The prior art practice is to cut the bandoleer of the unwanted gauge size and expel the portion of the bandoleer remaining in the tool before loading the prior bandoleer. Very often the expelled portion can not be reused or even if reusable constitutes a very short bandoleer segment. As a result, the operator tends to misplace, lose or simply not reload the power tool with a short bandoleer segment in order to use that segment, particularly if more contacts that are included within the segment are then required. More often than not, the bandoleer segment would simply be thrown away or otherwise be disregarded.

Many modifications may be made by those having ordinary skill in the art without departing from the spirit and scope of the invention. The illustrated embodiment has thus been set forth only for the purposes of example and should not be taken as limiting the invention which is defined in the following claims.

I claim:

1. A contact carrier including an arbitrarily sized and designed electrical contact temporarily disposed therein comprising:

a body;

means included within said body for temporarily retaining said electrical contact;

a male connector means extending from said body and connected therewith; and a female connector means extending from said body and connected therewith, said female connector means arranged and configured to temporarily engage said male connector means of one of said adjacent contact carriers, said plurality of contact carriers being assembled into a bandoleer of contact carriers for use in said power crimping tool, each of said contact carriers of said bandoleer being arbitrarily positioned in a linear sequence of contact carriers formed by said plurality of contact carriers comprising said bandoleer, whereby said bandoleer is assembled from an arbitrary sequence of said contact carriers, each contact carrier capable of including an arbitrary type or size of electrical contact.

2. The contact carrier of claim 1 wherein said body has an exterior surface and a longitudinal axis and wherein said male connector means and female connector means radially extend from said exterior surface of said body.

3. The contact carrier of claim 2 wherein said male connector means and female connector means radially extend from diametrically opposing positions on said exterior surfaces of said body.

4. The contact carrier of claim 1 wherein said male connector means of one contact carrier and said female connector means of another contact carrier are arranged and configured to resiliently engage and disengage each other.

5. The contact carrier of claim 4 wherein said male connector means is a radially extending web having a base, said web being connected at its base to said body, said web having a longitudinal bulbous portion of enlarged cross section, and wherein said female connector means is a longitudinal socket radially extending from said body defining an interior cavity for receiving said bulbous portion of said web and further including a restriction of smaller spatial extent than said diameter of said bulbous portion of said web, said restriction of said female connector means being resilient to temporarily permit passage of said bulbous portion of said web of said male connector means from an adjacent one of said contact carrier through said restriction, said restriction closing on said web of said male connector means of said adjacent carriers, whereby said adjacent carriers are resiliently engaged with each other.

6. The contact carrier of claim 5 wherein said body includes an internal shoulder portion having a contact bore defined therethrough, said contact bore having a selected diameter corresponding to the gauge of said contact disposed in said contact carrier, said diameter of said contact bore being arbitrarily chosen within the inherent size limitations of said corresponding contact carrier, whereby contacts of arbitrary gauges may be accommodated by each of said contact carriers.

7. A bandoleer of contact carriers, each contact carrier including an electrical contact of arbitrary gauge within said corresponding contact carrier, said bandoleer for use within a crimping tool and comprising:

a plurality of contact carriers, each contact carrier comprising a separate body from each other one of said contact carriers; and means included within each contact carrier for selectively and temporarily mechanically coupling arbitrary ones of said contact carriers with each other to form said bandoleer.

8. The bandoleer of claim 7 wherein each contact carrier is formed of resilient material and wherein said means for coupling said contact carriers with each other is for resiliently mechanically coupling adjacent contact carriers.

9. The bandoleer of claim 8 wherein said means for coupling said contact carriers comprises a male connector having a bulbous portion and a female connector forming a socket arranged and configured to receive said bulbous portin of said male connector, said bulbous portion being retained within said socket of said female connector by means of a resilient restrictive passage through which said bulbous portion of said male connector is inserted.

10. The bandoleer of claim 9 wherein said contact carrier has an exterior surface and wherein said male and female connectors are longitudinally exposed on said exterior surface of said contact carrier and radially extend therefrom.

11. The bandoleer of claim 7 wherein said plurality of contact carriers comprising said bandoleer includes a plurality of electrical contacts of different gauges within said bandoleer.

12. The bandoleer of claim 11 wherein said contact carriers comprising said bandoleer are assembled within said bandoleer in a preselected sequence according to said gauge of said electrical contact included within each corresponding contact carrier and a predetermined sequence of crimped contacts to be fabricated.

13. The bandoleer of claim 7 wherein said plurality of contact carriers comprising said bandoleer includes a plurality of different types of electrical contacts disposed within each of said corresponding contact carriers.

14. The bandoleer of claim 13 wherein said contact carriers comprising said bandoleer are assembled within said bandoleer in a preselected sequence according to said gauge of said electrical contact included within each corresponding contact carrier and a predetermined sequence of crimped contacts to be fabricated.

15. A method for providing a bandoleer of contact carriers, each contact carrier including an electrical contact having a gauge, said gauge of each electrical contact being arbitrarily and selectively varied according to a predetermined fabrication sequence, said method comprising the steps of:

providing a plurality of said contact carriers, each contact carrier having an identical outside configuration, each contact carrier including a means for resiliently being coupled to an adjacent contact carrier, each contact carrier being a separate integral body; and resiliently coupling each of said contact carriers to form a bandoleer of contact carriers, said contact carriers being combined in sequence to form said bandoleer according to said gauge of said electrical contact within each corresponding contact carrier according to said fabrication sequence, whereby each bandoleer is customized to said fabrication sequence and provides an appropriate gauge electrical contact at each step within said fabrication sequence.

16. The method of claim 15 where in said step of providing said contact carriers each including means for resiliently coupling carriers one to each other, said contact carriers are provided each with a male coupling and a diametrically opposed female coupling, said female coupling arranged and configured to resiliently engage a male coupling of an adjacent contact carrier.

17. The method of claim 16 where in said step of providing said contact carriers said female coupling is a socket cavity, said contact carriers being generally cylindrical and having a longitudinal axis, said female connector is longitudinally disposed and radially extends from said contact carrier said male connector having a longitudinally disposed bulbous portion radially extending from said contact carrier and where in said step of resiliently coupling adjacent contact carriers with each other said bulbous portion is inserted into said female socket, said female socket having a restricted opening smaller than said bulbous portion but resiliently opening to effect said resilient coupling with said male connector of an adjacent contact carrier.

18. The method of claim 15 where in said step of resiliently coupling said contact carriers with each other, said contact carriers include an electrical contact of a distinguishable type, said bandoleer of electrical contact carriers being assembled by resiliently coupling a selected sequence of contact types according to said fabrication sequence.

19. The method of claim 15 where in said step of providing said contact carriers, each contact carrier corresponding to an electrical contact of a distinct gauge has a correspondingly distinct color, whereby said bandoleer is color coded according to said fabrication sequence.

20. The method of claim 18 where in said step of providing said contact carriers each contact carrier having a distinct type of electrical contact therein has a corresponding distinct color, whereby said types of contacts in said bandoleer are color-coded.

* * * * *